United States Patent
Narayanaswamy et al.

(10) Patent No.: US 8,610,079 B2
(45) Date of Patent: Dec. 17, 2013

(54) ROBUST RADIATION DETECTOR AND METHOD OF FORMING THE SAME

(75) Inventors: Mahesh Raman Narayanaswamy, Waukesha, WI (US); Gregory Scott Zeman, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 223 days.

(21) Appl. No.: 12/976,878

(22) Filed: Dec. 22, 2010

(65) Prior Publication Data

US 2011/0158387 A1    Jun. 30, 2011

Related U.S. Application Data

(60) Provisional application No. 61/290,373, filed on Dec. 28, 2009.

(51) Int. Cl.
*G01T 1/20* (2006.01)

(52) U.S. Cl.
USPC ..................................... 250/370.11

(58) Field of Classification Search
USPC .................................... 250/370.11
See application file for complete search history.

(56) References Cited

U.S. PATENT DOCUMENTS

| | | | |
|---|---|---|---|
| 5,773,829 A * | 6/1998 | Iwanczyk et al. | 250/367 |
| 6,449,331 B1 * | 9/2002 | Nutt et al. | 378/19 |
| 6,510,195 B1 * | 1/2003 | Chappo et al. | 378/19 |
| 6,584,167 B1 | 6/2003 | Ikhlef et al. | |
| 6,726,489 B2 | 4/2004 | Kappel et al. | |
| 7,010,084 B1 | 3/2006 | Moritake et al. | |
| 7,010,088 B2 | 3/2006 | Narayanaswamy et al. | |
| 7,074,056 B2 | 7/2006 | Kappel et al. | |
| 7,187,750 B1 | 3/2007 | Hsieh et al. | |
| 7,233,640 B2 | 6/2007 | Ikhlef et al. | |
| 7,439,516 B2 | 10/2008 | Zeman et al. | |
| 7,605,374 B2 | 10/2009 | Hoggatt et al. | |
| 2006/0165214 A1 * | 7/2006 | Mattson et al. | 378/19 |
| 2006/0289777 A1 | 12/2006 | Li et al. | |
| 2007/0210259 A1 * | 9/2007 | Kerwin et al. | 250/370.11 |
| 2009/0021629 A1 * | 1/2009 | Yamada | 348/311 |
| 2009/0121146 A1 * | 5/2009 | Luhta et al. | 250/370.11 |

* cited by examiner

*Primary Examiner* — Christine Sung
(74) *Attorney, Agent, or Firm* — Fletcher Yoder, P.C.

(57) ABSTRACT

The present disclosure relates to radiation detectors having a layer of a high Z material, such as tungsten or lead, disposed on a face of a photodetector layer or other underlying layer. In one embodiment, the layer of the high Z material substantially prevents radiation from reaching on or more electronics components or circuits, such as an analog-to-digital conversion ASIC or other circuit.

5 Claims, 4 Drawing Sheets

ROBUST RADIATION DETECTOR AND METHOD OF FORMING THE SAME

CROSS-REFERENCE TO RELATED APPLICATIONS

This application is a Non-Provisional of U.S. Provisional Patent Application No. 61/290,373, entitled "Robust Radiation Detector and Method of Forming The Same", filed Dec. 28, 2009, which is herein incorporated by reference in its entirety for all purposes.

BACKGROUND OF THE INVENTION

The subject matter disclosed herein relates to radiographic detectors for non-invasive imaging and particularly to the construction and use of a metalized radiation detector.

In radiographic systems, an X-ray source emits radiation (e.g., X-rays) towards an object or subject (e.g., a patient, a manufactured part, a package, or a piece of baggage) to be imaged. As used herein, the terms "subject" and "object" may be interchangeably used to describe anything capable of being imaged. The emitted X-rays, after being attenuated by the subject or object, typically impinge upon an array of radiation detector elements of an electronic detector. The intensity of radiation reaching the detector is typically dependent on the attenuation and absorption of X-rays through the scanned subject or object. At the detector, a scintillator may convert some of the X-ray radiation to lower energy optical photons that strike detector elements configured to detect the optical photons. Each of the detector elements then produces a separate electrical signal indicative of the amount of optical light detected, which generally corresponds to the incident X-ray radiation at the particular location of the element. The electrical signals are collected, digitized and transmitted to a data processing system for analysis and further processing to reconstruct an image.

While much of the radiation (e.g., X-rays) is converted by a scintillator into lower energy optical photons, some amount of the radiation may pass through the scintillator without being absorbed and/or converted. Such radiation may act to degrade any electronics or circuitry positioned in the path of the radiation. As a result, it may not be feasible to position such electronics or circuitry in the detector and/or within the radiation path.

BRIEF DESCRIPTION OF THE INVENTION

In one embodiment, a radiation detector is provided. The radiation detector includes a scintillator layer configured to convert incident radiation into lower energy optical photons. The radiation layer also includes a photodetector layer configured to detect the lower energy photons generated by the scintillator, wherein the photodetector layer comprises a layer of high Z material. The radiation detector also includes signal electronics configured to receive signals generated by the photodetector layer, wherein the signal electronics are substantially shielded from radiation by the layer of high Z material.

In another embodiment, a photodetector layer is provided. The photodetector layer includes a plurality of photodiodes. The plurality of photodiodes each include a substrate layer. P regions and N regions are formed within the substrate layer to form P-N junctions. An oxide layer is disposed over portions of the substrate layer, the P regions, and the N regions. A layer of a high Z-material is disposed over portions of the oxide layer and over those portions of the N regions and P regions not covered by the oxide layer. One or more conductive structures are disposed on portions of the high Z material.

In a further embodiment, an imaging system is provided. The imaging system includes a radiation source configured to emit radiation and a radiation detector configured to detect the emitted radiation. The radiation detector includes a scintillator layer configured to convert the emitted radiation to optical photons and a photodetector layer configured to detect the optical photons and to generate responsive signals. The photodetector layer includes a radiation blocking layer. The radiation detector also includes signal electronics configured to receive and process the responsive signals. The signal electronics are protected from the emitted radiation by the radiation blocking layer. The imaging system also includes signal acquisition and processing circuitry configured to receive signals from the signal electronics.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

The present disclosure provides for placing circuitry and/or electronics proximate to scintillator and photodiode layers of a radiographic imaging system detector (or otherwise within the radiation path). For example, signal electronics (e.g., analog-to-digital conversion circuitry) may be provided in close proximity to the photodiodes or other readout components of a radiation detector. In some such embodiments, an electrically conductive metalization layer, such as a tungsten layer, may be provided between a photodiode layer of the detector panel and the signal electronics to prevent incident radiation from reaching the signal electronics. Such a detector may be utilized in a variety of radiographic imaging systems, such as computed tomography (CT) systems, fluoroscopic imaging systems, mammography systems, angiography imaging systems, tomosynthesis imaging systems, conventional radiographic imaging systems, and so forth.

By way of example, in accordance with one embodiment, a CT imaging system is provided. The CT imaging system includes a metalized detector having signal electronics provided directly behind the scintillator/photodiode assembly. The present discussion is generally provided in the context of a 3rd generation CT system, however, the present disclosure is equally applicable to other systems. For simplicity, the present discussion generally describes the use of detectors and X-ray imaging systems in a medical imaging context. However, it should be appreciated that the described radiation detectors may also be used in non-medical contexts (such as security and screening systems and non-destructive detection systems).

Figure 1:
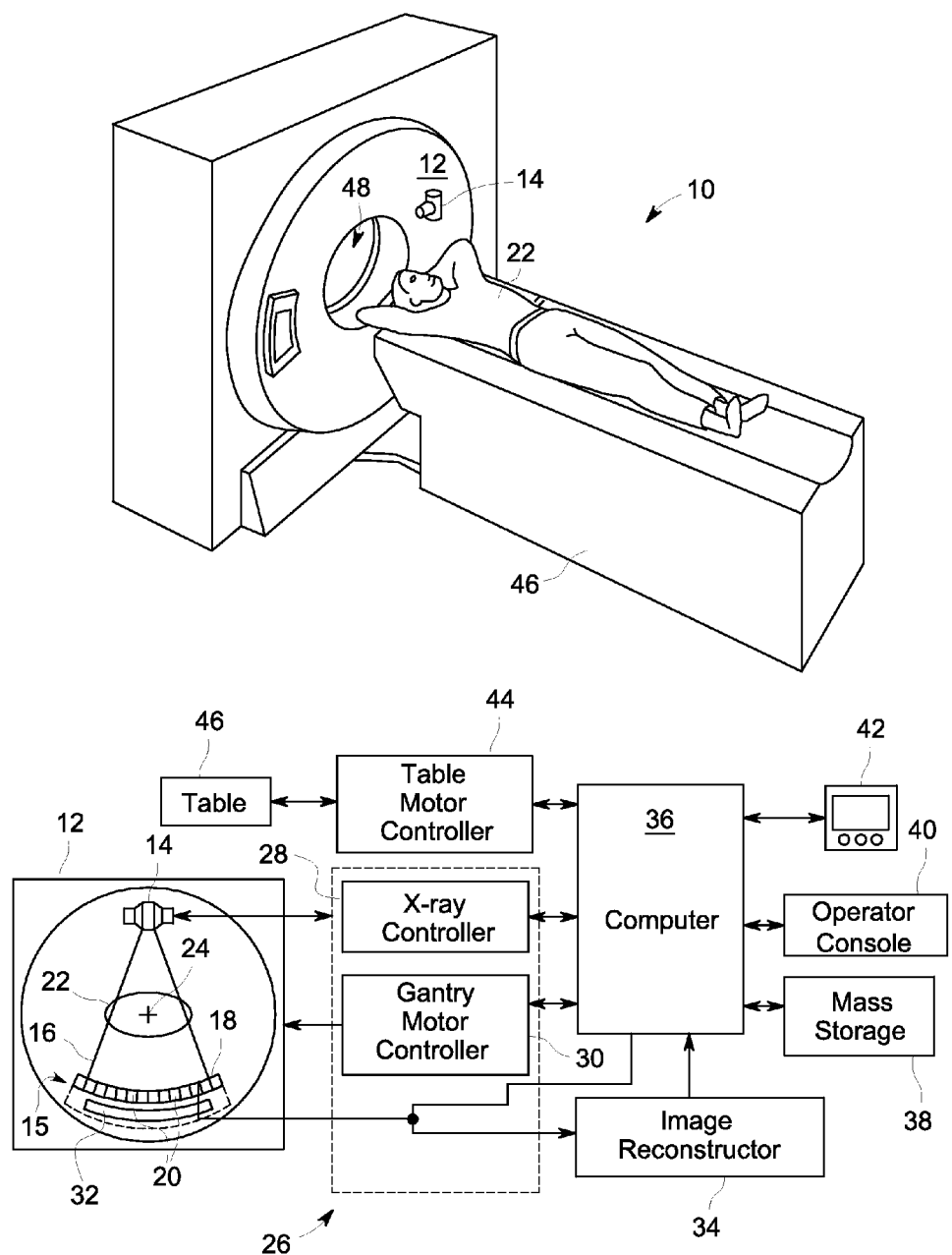
FIG. 1 is a combined pictorial view and block diagram of a CT imaging system illustrating an embodiment of the present disclosure.

With the foregoing in mind and referring to FIG. 1, a computed tomography (CT) imaging system 10 is shown as including a gantry 12 representative of a "third generation" CT scanner. Gantry 12 has an X-ray source 14 that projects a beam of X-rays 16 toward a detector assembly 15 on the opposite side of the gantry 12. The detector assembly 15 includes a collimator assembly 18, a plurality of detector modules 20, and data acquisition systems (DAS) 32. The plurality of detector modules 20 detect the projected X-rays that pass through a medical patient 22, and DAS 32 converts the data to digital signals for subsequent processing. Each detector module 20 in a conventional system produces an analog electrical signal that represents the intensity of an impinging X-ray beam and hence the attenuated beam as it passes through the patient 22. During a scan to acquire X-ray projection data, gantry 12 and the components mounted thereon rotate about a center of rotation 24.

Rotation of gantry 12 and the operation of X-ray source 14 are governed by a control mechanism 26 of CT system 10. Control mechanism 26 includes an X-ray controller 28 that provides power and timing signals to an X-ray source 14 and a gantry motor controller 30 that controls the rotational speed and position of gantry 12. An image reconstructor 34 receives sampled and digitized X-ray data from DAS 32 and performs high-speed reconstruction. The reconstructed image is applied as an input to a computer 36, which stores the image in a mass storage device 38. Computer 36 also receives commands and scanning parameters from an operator via console 40. An associated display 42 allows the operator to observe the reconstructed image and other data from computer 36. The operator supplied commands and parameters are used by computer 36 to provide control signals and information to DAS 32, X-ray controller 28, and gantry motor controller 30. In addition, computer 36 operates a table motor controller 44, which controls a motorized table 46 to position patient 22 and gantry 12. Particularly, table 46 moves portions of patient 22 through a gantry opening 48.

Figure 2:
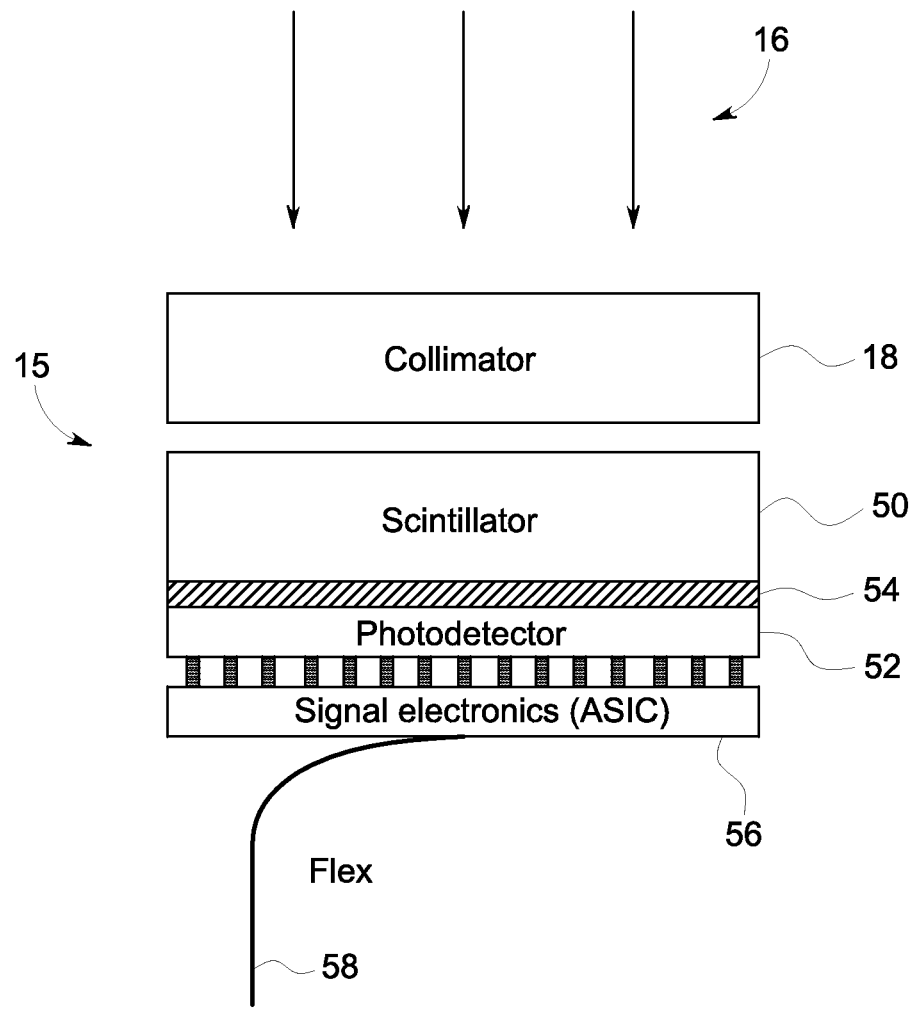
FIG. 2 depicts components of a detector assembly in accordance with an embodiment of the present disclosure.

Referring now to FIG. 2, a sectional view of a detector 15 operating in accordance with certain aspects of the present disclosure is illustrated. During imaging, radiation 16 (e.g., X-rays) from an imaging source 12 impinge on a scintillator 50 after being attenuated by an intervening subject or object undergoing imaging. In the depicted embodiment, the X-rays 16 are collimated by a collimator 18, after passing through the subject or object but prior to reaching the scintillator 50. Such collimation may provide some degree of X-ray scatter rejection and/or correction.

Typically, the scintillator 50 is formed from a substance that absorbs radiation 16 (for example X-ray photons) and in response emits light of a characteristic wavelength, such as an optical wavelength, thereby releasing the absorbed energy. With regard to the present technique, various types of scintillation materials may be employed which convert the radiation incident on the detector assembly 20, such as X-rays photons, into a form of radiation detectable by the photodetector layer 52, e.g., a layer of photodiodes. Thus, in such an implementation, X-ray photons impinging on the detector assembly 15 can be detected by the photodetector layer 52, so long as the impinging X-ray photons interact with the scintillator 50 to generate one or more detectable photons, such as optical photons.

In one embodiment, the photodetector layer 52 is bonded to the scintillator 50 by an epoxy bonding material 54 or other suitable optical coupler. The photodetector layer 52 generates analog electrical signals in response to the light emitted by the scintillator 50. The electrical signals generated by the photodetector layer 52 are in turn acquired by signal electronics 56.

The signals from the signal electronics 56 may in turn be acquired by the data acquisition circuitry 32 (FIG. 1). As discussed above, the acquired signals are supplied to data processing circuitry and/or to image reconstruction circuitry.

In conventional arrangements, the analog signals generated by the photodetector layer 52 might be conducted by a conductive analog path to a downstream location for conversion from analog form to digital form and for subsequent processing. In such arrangements, the analog path typically conducts the analog signals to a downstream location that is spaced apart from the photodetector layer 52 and/or otherwise out of the path of any radiation (e.g., X-rays) that is not converted by the scintillator 50 or otherwise absorbed. In this way, the electronics performing the analog-to-digital signal conversion and any additional processing are protected from incidental radiation that is not absorbed and converted by the scintillator. Such arrangements, however, can lead to the introduction of noise to the signal in proportion to the length of the analog pathway. In addition, a lengthy analog pathway also introduces design complexity to the detector and associated circuitry.

In certain embodiments of the present disclosure, signal electronics 56 (such as the analog-to-digital conversion circuitry) is provided directly behind the photodetector layer 52, i.e., in the path of any unconverted and/or unabsorbed radiation. In such an implementation, the length of the analog path is greatly reduced or the analog path is eliminated altogether. In one such embodiment, the signal electronics 56 is provided as one or more chips or application specific integrated circuits (ASICs) (i.e., silicon packages) directly connected to photodiodes of the photodetector layer 52. In such an embodiment, the ASICs may convert the analog signals generated at the photodiodes to digital signals for subsequent processing. For example, in the depicted embodiment, the signal electronics 56 are provided as a two-sided silicon package with one side directly connected to photodiodes of the photodetector layer 52 and the other side connected to a flex circuit 58 configured to conduct the converted digital signals downstream for subsequent processing.

While providing the signal electronics 56 directly behind and proximate to the photodetector layer 52 may address some of the issues introduced by the use of a lengthy analog path, such an arrangement also exposes the signal electronics 56 to potentially harmful radiation 16 to the extent such radiation is not absorbed or converted prior to reaching the signal electronics 56. Therefore, in one embodiment of the present disclosure, the backside of the photodetector layer 52 (i.e., the side facing signal electronics 56) is coated or reinforced with a high Z (i.e., high atomic number) material suitable for absorbing or otherwise blocking radiation (e.g., X-rays). In one such embodiment, the high Z material is an electrically conductive material, such as a material suitable for conducting electrical charges and/or signals. For example, in one embodiment, the backside of the photodetector layer 52 is metalized with tungsten (atomic number 74). The high Z material can thereby protect the signal electronics 56 from incident radiation. Other examples of high Z materials that may be employed include, but are not limited to, hafnium (atomic number 72), molybdenum (atomic number 42), lead (atomic number 82), tantalum (atomic number 73), and so forth. Thus, in one embodiment, a high Z material may be a material having an atomic number greater than 42. In another embodiment, a high Z material may be a material having an atomic number greater than 72.

Figure 3:
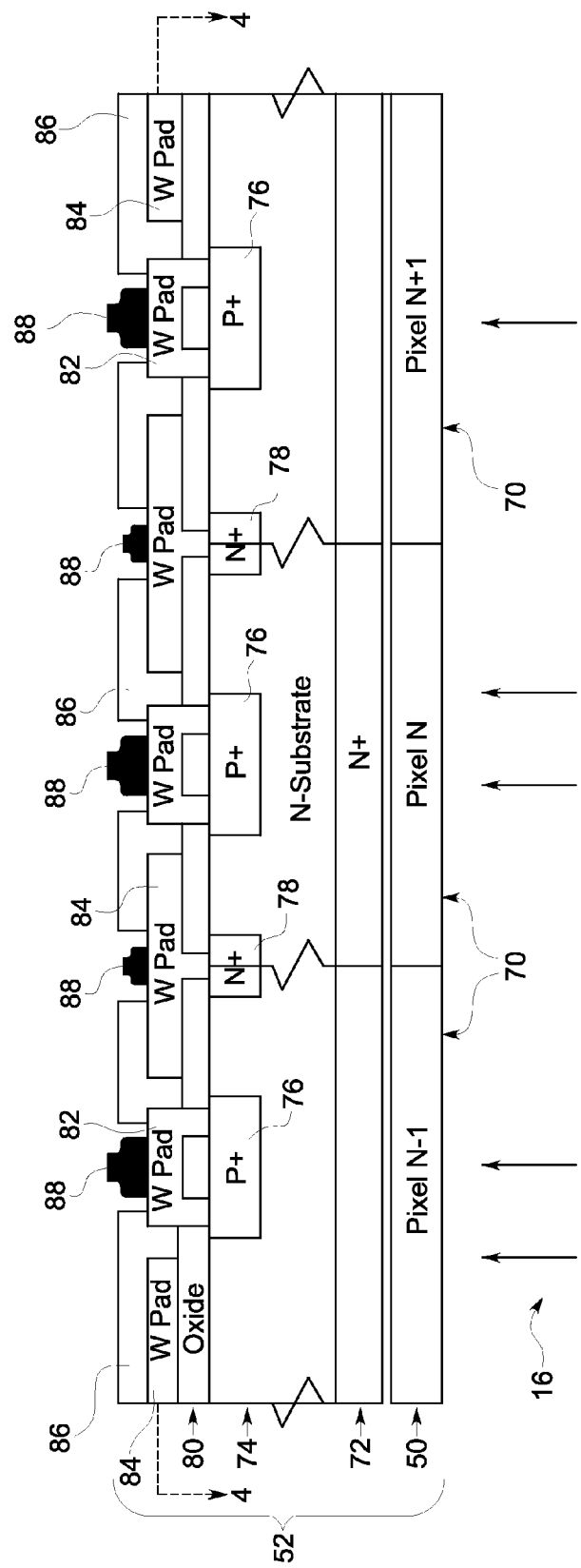
FIG. 3 depicts a cross-sectional view of a photodetector layer of a detector assembly in accordance with an embodiment of the present disclosure.

For example, referring to FIG. 3, a sectional view of a photodetector layer 52 is provided, wherein the photodetector layer 52 includes a photodiode formed at each respective pixel 70. In the depicted example, the photodiodes are provided in a backlit arrangement in which X-rays 16 are incident upon a face of the photodetector layer 52 opposite the structures 72 configured to conduct the generated signals away from the photoconductor layer 52. In the present view, three adjacent pixels (N−1, N, N+1) 70 are depicted.

The depicted photodetector layer 52 includes a variety of respective sub-layers, as discussed herein. For example, in the depicted embodiment, the photodetector layer 52 includes an N+ layer 72 along the surface facing the incident radiation 16. Underlying this layer is an N substrate 74 in which various interspersed P+ regions 76 and N+ regions 78 are formed as P-N junctions of the respective photodiodes (e.g. anodes surrounds by a common cathode grid). In the depicted embodiment, an oxide layer 80 helps protect the respective underlying P and N regions.

Figure 4:
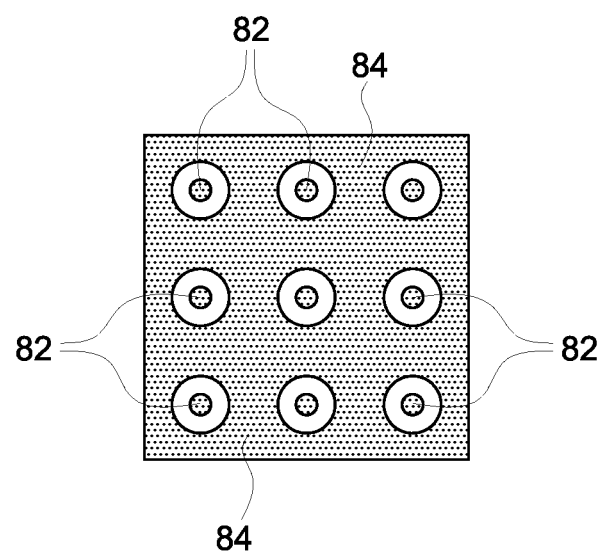
FIG. 4 depicts a plan view of a metalization layer of the photodetector layer of FIG. 3, taken along view line 4, in accordance with an embodiment of the present disclosure.

In one embodiment, a layer of a high Z material, such as tungsten, lead, hafnium, molybdenum, tantalum, or another X-ray blocking material, is provided over the oxide layer 80 and/or over the P+ regions 76 and N+ regions 78 not covered by the oxide layer 80. In one implementation, the high Z material is an electrically conductive material. For instance, in the depicted embodiment, tungsten pads 82 are formed that each respectively contact a P+ region 76, thereby forming a respective anode connection for each photodiode. In addition a common tungsten layer 84 is formed that interconnects the respective N+ region 78, thereby providing a common cathode connection for the respective photodiodes. In one embodiment, the tungsten pads 82 and layer 84 are formed concurrently by a suitable deposition process and may have a thickness between about 10μ and about 100μ. Turning briefly to FIG. 4, a view of an embodiment of tungsten metalized photodiodes corresponding to nine pixels, taken along view line 4 of FIG. 3, is depicted. In one such embodiment, the surface area covered by the tungsten pads 82 and tungsten layer 84 effectively shield signal electronics 56 from incoming radiation while providing a conductive structure Turning back to FIG. 3, a polyimide passivation layer 86 may be provided over portions of the tungsten pads 82 and layer 84 to prevent shorting between the P and N regions. In addition, suitable conductive contacts 88, e.g., stud bumps, solder balls, and so forth, may be formed over each of the tungsten pads 82 and over some or all of the tungsten layer 84 overlying the N+ regions. The conductive contacts may be formed from gold, aluminum, copper, silver, or any other suitable conductive material. The conductive contacts 88 may, in one embodiment, be used to electrically connect to suitable electronics or circuitry (e.g., signal electronics 56) and/or to ground, depending of the contact 88. For example, suitable conductive contacts 88 may be directly connected to an ASIC for performing analog-to-digital signal conversion, without an intervening analog pathway. The ASIC in turn may be shielded from radiation by the tungsten, lead, hafnium, molybdenum, tantalum, or other high Z material coated over the diodes, as depicted in FIGS. 3 and 4.

While the preceding sets forth one possible embodiment of a photodetector layer, it should be appreciated that other implementations are also possible. For example, though the embodiment described above is formed on an N substrate 74, a P type substrate may instead be employed. When an N type substrate is employed, as discussed above, the P+ and N+ regions form, respectively, anode and cathode/ground structures. Conversely, in embodiments in which a P type substrate is employed, the N+ region would constitute the anode, and the P+ region would constitute the cathode/ground.

As may be appreciated, the various layers and regions of the photodiode structure depicted in FIG. 3 may be generated and/or formed using conventional techniques known in the art of semi-conductor manufacture. Such techniques may include, but are not limited to, chemical vapor and/or plasma deposition, doping, implantation, epitaxy, diffusion, etching, and/or sputtering techniques.

Technical effects of the invention include a radiation detector having signal electronics, such as an analog-to-digital ASIC, directly connected to a photodetector layer, with little or no intervening analog pathway. Another technical effect is a radiation detector having a photodiode, such as a backlit photodiode, that is metalized with a high Z material on one side to prevent radiation damage to electronics or circuitry connected to the photodiode.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A photodetector layer comprising:
   a plurality of photodiodes, each photodiode comprising:
      a substrate layer;
      P regions and N regions formed within the substrate layer to form P-N junctions;
      an oxide layer disposed over portions of the substrate layer, the P regions, and the N regions;
      a layer of a high Z-material disposed over portions of the oxide layer and over those portions of the N regions and P regions not covered by the oxide layer; and
      one or more conductive structures disposed on portions of the high Z material.

2. The photodetector layer of claim 1, comprising a passivation layer disposed over portions of the layer of high Z material.

3. The photodetector layer of claim 1, wherein the layer of high Z material comprises one or more of tungsten, lead, hafnium, molybdenum, or tantalum.

4. The photodetector layer of claim 1, wherein the layer of high Z material comprises a layer of tungsten between about 10μ and about 100μ in thickness.

5. The photodetector layer of claim 1, wherein the one or more conductive structures comprise one or more stud bumps.

* * * * *